(12) United States Patent
Oh et al.

(10) Patent No.: US 9,412,861 B2
(45) Date of Patent: Aug. 9, 2016

(54) SEMICONDUCTOR DEVICE HAVING STRUCTURE CAPABLE OF SUPPRESSING OXYGEN DIFFUSION AND METHOD OF MANUFACTURING THE SAME

(71) Applicant: Industry-Academic Cooperation Foundation, Yonsei University, Seoul (KR)

(72) Inventors: HoonJung Oh, Goyang (KR); DaeHong Ko, Goyang (KR); SangMo Koo, Seoul (KR); InGeun Lee, Incheon (KR); Hwan Lee, Seoul (KR); DaeSub Byun, Seoul (KR); HyunCheol Jang, Uijeongbu (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 14/616,856

(22) Filed: Feb. 9, 2015

(65) Prior Publication Data

US 2015/0228778 A1 Aug. 13, 2015

(30) Foreign Application Priority Data

Feb. 11, 2014 (KR) ........................ 10-2014-0015458

(51) Int. Cl.
| | |
|---|---|
| *H01L 29/00* | (2006.01) |
| *H01L 29/78* | (2006.01) |
| *H01L 21/02* | (2006.01) |
| *H01L 21/285* | (2006.01) |
| *H01L 29/51* | (2006.01) |
| *H01L 21/28* | (2006.01) |

(52) U.S. Cl.
CPC ............ *H01L 29/78* (2013.01); *H01L 21/0206* (2013.01); *H01L 21/02046* (2013.01); *H01L 21/02049* (2013.01); *H01L 21/02063* (2013.01); *H01L 21/02359* (2013.01); *H01L 21/28185* (2013.01); *H01L 21/28194* (2013.01); *H01L 21/28506* (2013.01); *H01L 29/51* (2013.01); *H01L 29/517* (2013.01); *H01L 29/518* (2013.01)

(58) Field of Classification Search
CPC ..... H01L 29/517; H01L 29/518; H01L 29/78; H01L 29/51
See application file for complete search history.

(56) References Cited

U.S. PATENT DOCUMENTS

| | | | | |
|---|---|---|---|---|
| 2010/0032667 | A1* | 2/2010 | Yamazaki | H01L 29/7869 257/43 |
| 2010/0035379 | A1* | 2/2010 | Miyairi | H01L 29/78606 438/104 |
| 2010/0109708 | A1* | 5/2010 | Koyama | H01L 27/1225 326/96 |
| 2011/0089416 | A1* | 4/2011 | Yamazaki | H01L 21/02565 257/43 |
| 2012/0015503 | A1* | 1/2012 | Yao | H01L 21/26506 438/478 |
| 2012/0139630 | A1* | 6/2012 | Ozaki | H01L 21/02057 330/250 |
| 2014/0077313 | A1* | 3/2014 | Li | H01L 21/823842 257/410 |
| 2014/0264484 | A1* | 9/2014 | Sassiat | H01L 21/2822 257/288 |
| 2014/0361291 | A1* | 12/2014 | Sasagawa | H01L 29/7869 257/43 |
| 2015/0132938 | A1* | 5/2015 | Ahmed | H01L 21/28176 438/591 |
| 2015/0140834 | A1* | 5/2015 | Kashefi | H01L 21/02304 438/771 |
| 2015/0140838 | A1* | 5/2015 | Kashefi | C23C 16/405 438/785 |

* cited by examiner

*Primary Examiner* — Ngan Ngo
(74) *Attorney, Agent, or Firm* — Lex IP Meister, PLLC

(57) ABSTRACT

A semiconductor device is provided. The device includes a substrate; a gate dielectric film formed on the substrate; a gate electrode formed on the gate dielectric film, and source and drain electrodes, wherein a boundary between the gate dielectric film and the substrate is formed with an F (fluorine)-terminated surface to serve as a barrier for preventing oxygen diffusion.

7 Claims, 4 Drawing Sheets

SEMICONDUCTOR DEVICE HAVING STRUCTURE CAPABLE OF SUPPRESSING OXYGEN DIFFUSION AND METHOD OF MANUFACTURING THE SAME

CROSS REFERENCE TO RELATED APPLICATION

The present application claims priority from Korean Patent Application Number 10-2014-0015458 filed on Feb. 11, 2014, the entire contents of which are incorporated herein for all purposes by this reference.

BACKGROUND OF THE INVENTION

1. Field of the Invention

The present invention relates to a semiconductor device, and more particularly to, a semiconductor device having a structure capable of suppressing oxygen diffusion and a method of manufacturing the same.

2. Description of Related Art

A semiconductor device technology, including a MOSFET (metal oxide semiconductor field effect transistor) having excellent on/off characteristics of an electronic device, has been rapidly developed through miniaturization and integration on the basis of silicon since 1960's, becomes a core technology of current mobile computing and communication devices and is widely applied to a variety of fields.

A method of manufacturing a device including the MOSFET is described with reference to FIG. 1. The method comprises processes of forming a MOSFET device part having a gate consisting of a gate dielectric film 2 and a gate electrode 3, a source and a drain on a semiconductor substrate 1, depositing an interlayer insulation film 4, forming contact holes 5 penetrating therethrough, filling the contact holes 5 with a conductive material 6 and forming a metal wiring 7. The device including the MOSFET has merits that the on/off characteristics are more sensitive than the other devices and miniaturization and integration thereof can be made by making the gate electrode small, making the gate dielectric film thin and increasing a dielectric constant while minimizing a change in process facilities.

In order to enable the MOSFET to smoothly operate, it is important to adjust electrical properties by adjusting characteristics of the respective thin film materials. For example, a research for changing materials of the MOS structure of which a substrate, a channel, a dielectric film and a gate electrode material are Si, $SiO_2$ and/or poly-Si into a high-mobility channel such as Ge or group compound semiconductor, a dielectric film having a high dielectric constant (high-k) such as $HfO_2$ and a metal gate electrode having no depletion of charges has been actively carried out. For the metal wiring, in order to further reduce the dielectric constant of the interlayer dielectric film 4 and to thus reduce an RC delay, a method of introducing a material such as SiOC to manufacture a device has been studied and developed.

In the meantime, the semiconductor device manufacturing method includes several tens to hundreds of processes. In order to increase a yield of the device manufacturing process, it is important to maintain and secure the characteristics of the materials, which are used for the MOSFET device manufacturing process, even when the materials are subject to a thermal process, in which the diffusion speed between the materials increases, and an oxygen introduction process, particularly, for example. In particular, the diffusion speed of the oxygen is fast and most of oxidation reactions are thermodynamically stable, so that the oxygen causes an unwanted oxidation process of the material used for the semiconductor process, which again causes physical and chemical reactions such as a volume expansion and a change in composition. A wet cleaning process of the related art, which is performed so as to clean a surface before the deposition or after the etching, is focused to remove the surface contaminants. That is, there is no effect such as diffusion suppression through surface modification. When impurities increase in the gate dielectric film or a composition thereof is changed even slightly, an electrical trap is formed to deteriorate the electrical characteristics of the gate dielectric film. In a case of the high-k dielectric film, when the oxygen diffusion occurs, a non-uniform oxide film grows between a channel layer of the substrate 1 and the gate dielectric film 2, so that the dielectric constant may be decreased. Also, when the oxygen diffusion occurs in a direction facing towards the gate electrode 3 from the gate dielectric film 2, a leakage current of the gate dielectric film may be increased. Also, the oxygen diffusion into the interlayer insulation film 4 may cause an increase in the dielectric constant, thereby reducing the device operating speed.

The information disclosed in the Background of the Invention section is provided only for enhancement of (or better) understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a semiconductor device and a method of manufacturing the same capable of suppressing an oxygen diffusion to prevent a semiconductor device from being deteriorated due to the oxygen diffusion occurring during the manufacturing process and to increase a yield of the semiconductor device manufacturing process.

In an aspect of the present invention, provided is a semiconductor device including a substrate; a gate dielectric film formed on the substrate; a gate electrode formed on the gate dielectric film, and source and drain electrodes, wherein a boundary between the gate dielectric film and the substrate is formed with an F (fluorine)-terminated surface to serve as a bather for preventing oxygen diffusion.

According to an illustrative embodiment of the present invention, a boundary between the gate dielectric film and the gate electrode may also be formed with the F-terminated surface.

According to an illustrative embodiment of the present invention, the semiconductor device may further include an interlayer insulation film configured to cover the gate electrode and the source and drain electrodes and formed with contact holes configured to lead the gate electrode and the source and drain electrodes, the contact holes being filled with a conductive material to thus form contacts, wherein boundaries between the source and drain electrodes and the contacts and boundaries between the source and drain electrodes and the interlayer insulation film are also formed with the F-terminated surface.

According to an illustrative embodiment of the present invention, at least one of a boundary between the interlayer insulation film and the substrate, boundaries between the contacts and the interlayer insulation film, a boundary between the interlayer insulation film and the gate dielectric film, and a boundary between the interlayer insulation film and the gate electrode may also be formed with the F-terminated surface.

According to an illustrative embodiment of the present invention, the F-terminated surface may be formed by a dry cleaning process of applying a plasma gas to a reaction gas comprising nitrogen, hydrogen and fluorine to generate a by-product and volatilizing the by-product.

According to an illustrative embodiment of the present invention, He, Ne, Ar or $N_2$ plasma gas may be used as the plasma gas.

According to an illustrative embodiment of the present invention, $NF_3+NH_3$, $NH_3+HF$ or $N_2+H_2+HF$ gas may be used as the reaction gas.

According to an illustrative embodiment of the present invention, a silicon compound insulation material selected from a group comprising $SiO_x$ and $SiN_x$, a metal oxide selected from a group comprising $Al_2O_3$, $HfO_2$, $ZrO_2$, $TiO_x$, $TaO_x$, $LaO_x$, $YO_x$ and $GdO_x$, a metal nitride or a combination thereof may be used as the gate dielectric film.

According to an illustrative embodiment of the present invention, a metal material selected from a group comprising Al, W, Cu, Pt, TiN, TaN, Ti, Ta and Pt or a silicon metal compound selected from a group comprising doped Si, $WSi_x$, $NiSi_x$, $CoSi_x$ and $TiSi_x$ may be used as the gate electrode.

According to an illustrative embodiment of the present invention, a compound selected from a group comprising $SiO_x$, $SiN_x$, $SiCO_x$, $SiCO_xN_y$, $SiCO_xH_y$ and a combination thereof may be used as the interlayer insulation film.

In an aspect of the present invention, there is provided a method of manufacturing a semiconductor device including the steps of performing a dry cleaning process on a surface of a substrate by using a plasma gas, thereby forming an F-terminated surface on the substrate, the F-terminated surface serving as a barrier for preventing oxygen diffusion; forming a gate dielectric film on the F-terminated surface of the substrate; forming a gate electrode on the gate dielectric film, and forming source and drain electrodes.

According to an illustrative embodiment of the present invention, the method may further include a step of performing the same dry cleaning process as the dry cleaning process, which has been performed on the surface of the substrate, on the gate dielectric film to form an F-terminated surface thereon to serve as a barrier for preventing oxygen diffusion before forming the gate electrode.

According to an illustrative embodiment of the present invention, the method may further include steps of performing the same dry cleaning process as the dry cleaning process, which has been performed on the surface of the substrate, for a semiconductor structure having the source and drain electrodes to thus form an F-terminated surface thereon to serve as a bather for preventing oxygen diffusion, and forming an interlayer insulation film, wherein surfaces contacting the interlayer insulation film are F-terminated.

According to an illustrative embodiment of the present invention, the method may further include steps of forming contact holes in the interlayer insulation film, performing the same dry cleaning process as the dry cleaning process, which has been performed on the surface of the substrate, in the contact holes to form F-terminated surfaces, and depositing a conductive material in the contact holes to form contacts.

According to an illustrative embodiment of the present invention, the F-terminated surface may be formed by the dry cleaning process of applying a plasma gas to a reaction gas comprising nitrogen, hydrogen and fluorine to generate a by-product and volatilizing the by-product.

According to an illustrative embodiment of the present invention, the by-product may be $(NH_4)_xMF_x$ or $MF_x$ by-product (M=Si, Ge or metal).

According to an illustrative embodiment of the present invention, He, Ne, Ar or $N_2$ plasma gas may be used as the plasma gas.

According to an illustrative embodiment of the present invention, $NF_3+NH_3$, $NH_3+HF$ or $N_2+H_2+HF$ gas may be used as the reaction gas.

According to an illustrative embodiment of the present invention, the by-product may be formed to have a thickness of 1,000 Å or smaller.

According to an illustrative embodiment of the present invention, the by-product may be volatilized by a heat treatment of 200° C. or lower.

As set forth above, during the semiconductor device manufacturing processes, the plasma dry cleaning process using $NH_3$ and $NF_3$ gases, for example, is performed to change the material surface including Si into the F-terminated surface, thereby improving the chemical stability. Therefore, it is possible to prevent the yield from being lowered due to the abnormal reaction resulting from the oxygen diffusion during the process and to preserve the characteristics of the respective materials. Thus, it is possible to reduce the noise during the device operation, thereby improving the electrical stability of the device. Also, it is possible to add the dry cleaning process, depending on the materials to be protected and the processes, so that it is possible to improve or regulate the device characteristics, in correspondence to a variety of device manufacturing processes.

The devices and methods of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Reference will now be made in detail to exemplary embodiments of the present invention in conjunction with the accompanying drawings. Herein, detailed descriptions of some technical constructions or terms well known in the art of the semiconductor device (for example, a MOSFET) will be omitted. Even if such descriptions are omitted, the features of the present invention will be apparent to a person skilled in the art from the following description.

Figure 1:
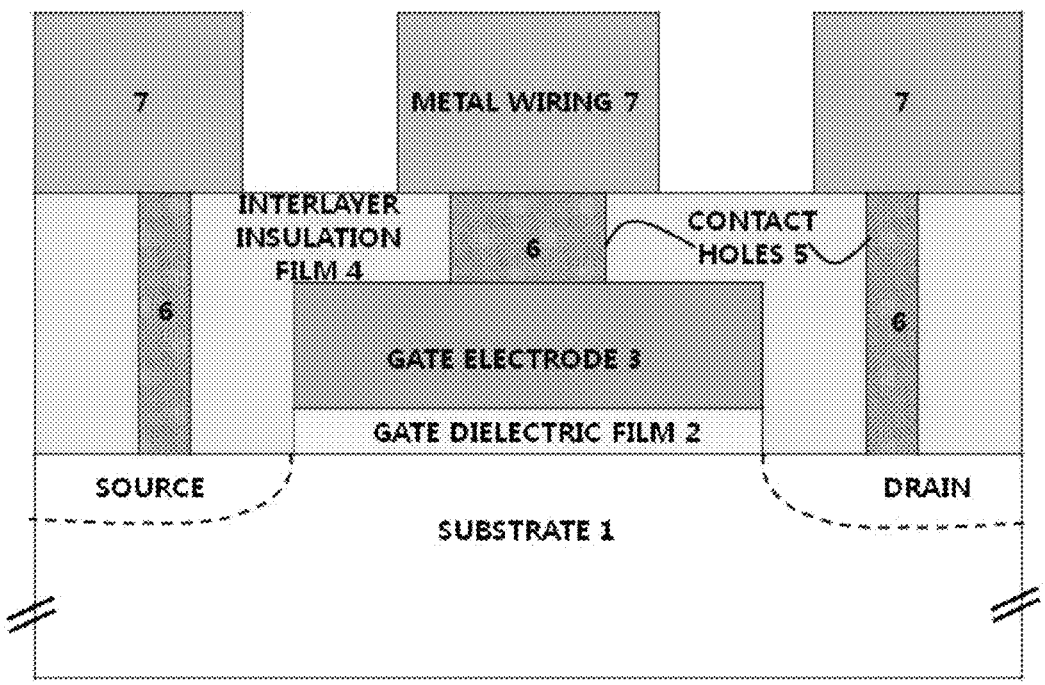
FIG. 1 illustrates a MOSFET structure of the related art.
Figure 2:
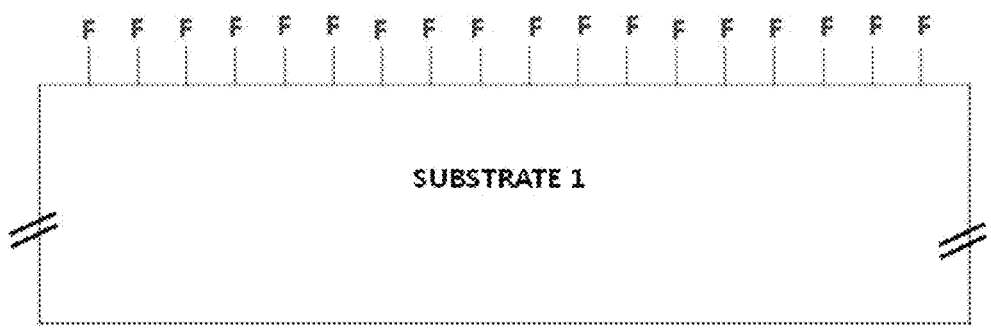
FIG. 2 is a pictorial view illustrating a state where a plasma dry cleaning process is performed on a substrate surface to make an F(fluorine)-terminated surface thereon in accordance with an illustrative embodiment of the present invention.
Figure 3:
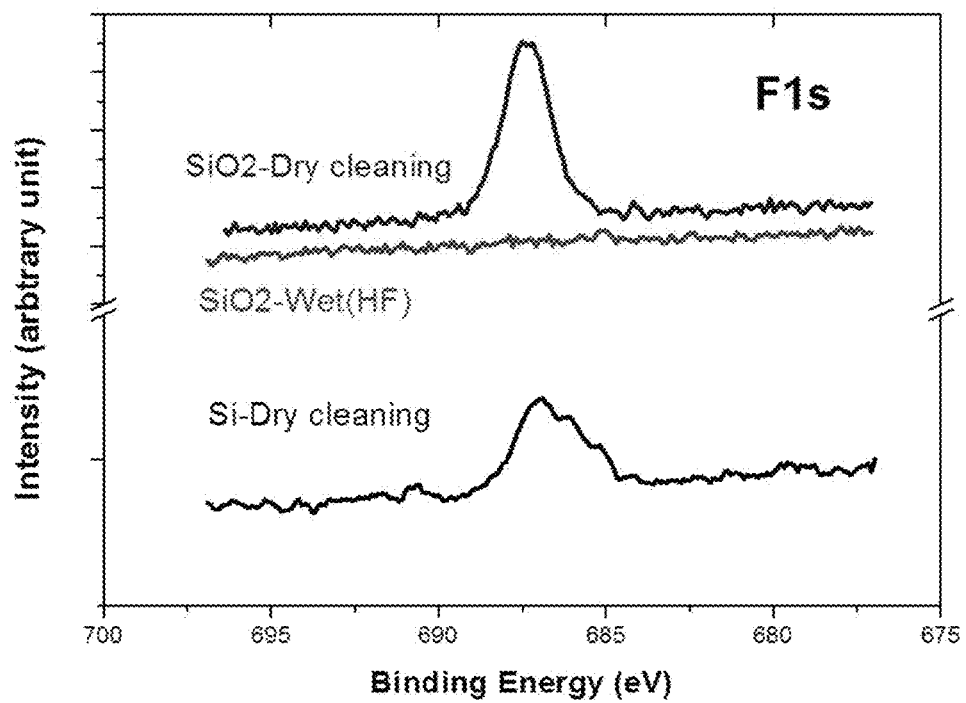
FIG. 3 is an XPS analysis result of the substrate surface for which the plasma dry cleaning process has been performed, illustrating that the fluorine exists on the substrate surface with being bonded to Si (i.e., Si—F bonding).

First, FIG. 2 illustrates a surface state after a Si substrate 1 is surface-treated using a dry cleaning method in accordance with an illustrative embodiment of the present invention. That is, the Si substrate 1 is dry-cleaned using plasma. In an illustrative embodiment, the Si substrate 1 was treated with $NF_3$ and $NH_3$ gases under conditions of 70 W, 1 Torr, $NF_3$ 50 sccm, $NH_3$ 100 sccm, He 900 sccm for 30 seconds and then annealed with $N_2$ at 180° C. (a dry cleaning process using plasma). After the process, an XPS (X-ray photoelectron spectroscopy) analysis was performed for the Si substrate (refer to FIG. 3). As can be seen from F1s peaks, the fluorine exists on the Si surface with being chemically bonded to Si (i.e., Si—F bonding) (hereinafter, this is referred to as F-terminated surface). This surface state cannot be obtained by a wet cleaning process using an HF solution and the like. That is, when the dry cleaning process is performed using $NF_3$ and $NH_3$ gases, $(NH_4)_2SiF_6$ or $SiF_x$ by-product is formed on the substrate surface. When the substrate is subject to an annealing treatment at a temperature below 200° C. (180° C., in the above illustrative embodiment), the by-product is volatilized. The fluorine (F) originating from the by-product being volatilized forms the Si—F bonding on the surface of the Si substrate.

Figure 4:
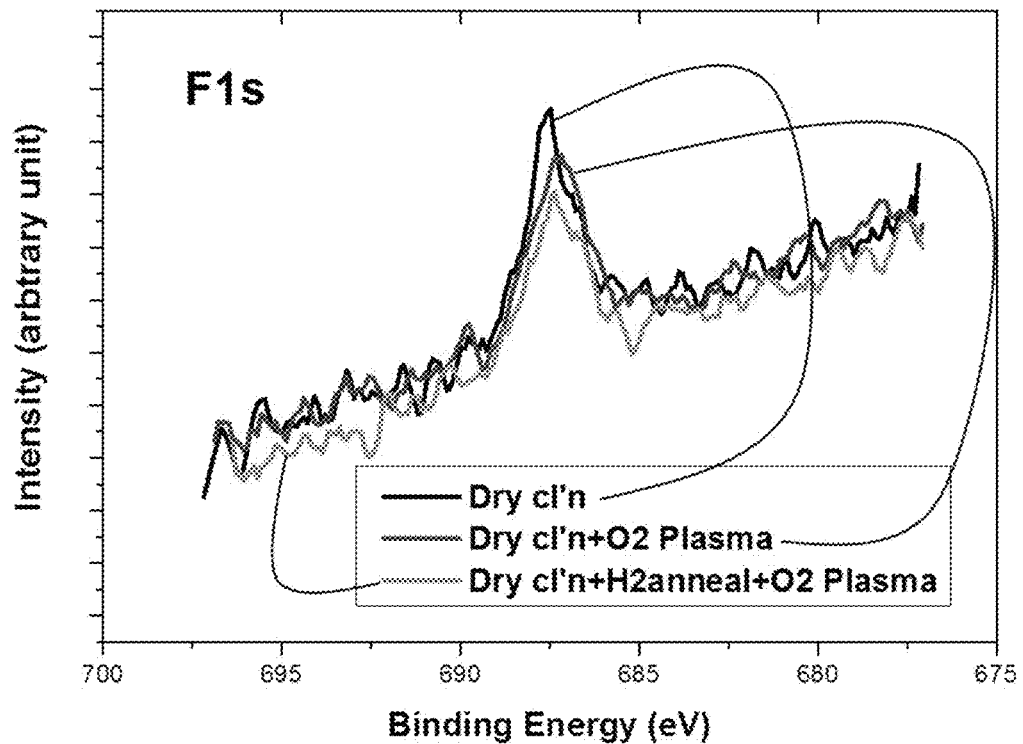
FIG. 4 is an XPS analysis result after an oxidation treatment of the $SiO_2$ film using oxygen plasma has been performed after the dry cleaning process, illustrating that the F-terminated oxide film is maintained, i.e., that a thickness of an $SiO_2$ film is not substantially changed even under strong oxidation conditions.

The inventors checked whether the Si—F bonding formed as described above is stably maintained. That is, after the dry cleaning process, the $SiO_2$ (Si substrate surface) was subject to oxidation conditions using the plasma energy (250° C., 6000 W, $O_2$ 10 slm (standard liter per minute; 1 slm=1,000 sccm) and then the XPS analysis was performed for the surface. As can be seen from F1s peaks of FIG. 4, the F-terminated surface of the Si substrate was maintained even under $O_2$ plasma oxidation conditions of strong oxidizing power. Also, the F-terminated surface of the Si substrate could be seen even under $O_2$ plasma oxidation conditions after the dry cleaning process and $H_2$ anneal (which is a reduction condition). A change in thickness of $SiO_2$ due to the $O_2$ plasma oxidation after the dry cleaning process was measured within a measurement error range. That is, it means that the F-terminated oxide film ($SiO_2$) of which the surface is not changed as regards the $O_2$ penetration and diffusion is maintained. Usually, upon the oxidation by the $O_2$ plasma, the stronger oxidation occurs, as compared to the typical oxidation conditions. However, it is experimentally confirmed that the F-terminated surface was maintained without a substantial change in the surface composition and the thickness even under the strong oxidation conditions (refer to FIG. 4). This means that the oxygen diffusion is suppressed by the F-terminated surface.

In the meantime, the $(NH_4)_2SiF_6$ or $SiF_x$ by-product, which is temporarily formed on the surface of the substrate by the dry cleaning process, is preferably formed to have a thickness of 1,000 Å or smaller and is preferably volatilized at a temperature of 200° C. or lower. That is, if the by-product is formed to be thicker than 1,000 Å or if the annealing treatment is performed at a temperature higher than 200° C., a contamination due to vapor phase reaction and re-adsorption upon the removal of the by-product may be caused, and the fluorine (F) diffusion may increase at the interface, so that it could be difficult to form the F-terminated surface.

Figure 5:
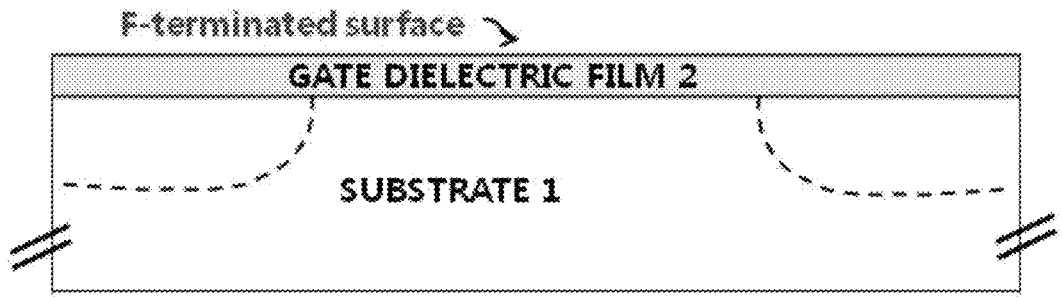
FIG. 5 is a pictorial view illustrating a surface state after the dry cleaning process has been performed for a gate dielectric film.
Figure 6:
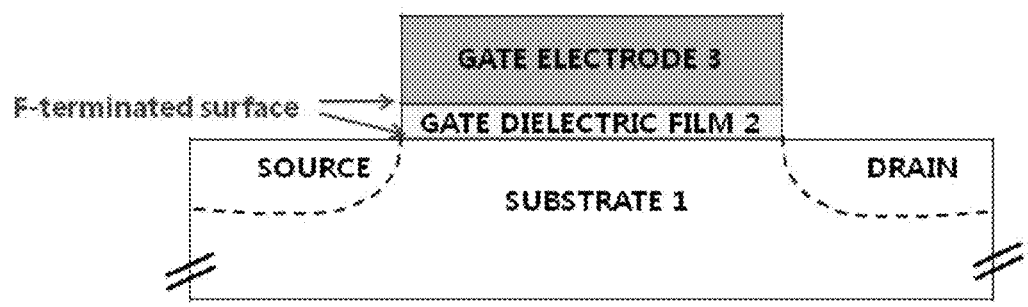
FIG. 6 illustrates a MOSFET structure wherein gate electrode film deposition and patterning processes are performed to implement a gate of the MOSFET structure, impurities are implanted in source and drain regions by a self-aligning way and the impurities of the source and drain electrodes are activated through a thermal process.

Subsequently, a gate dielectric film 2 is deposited and then the same dry cleaning process as the above dry cleaning process is performed to form the F-terminated surface on a surface of the gate dielectric film (refer to FIG. 5). Then, a gate electrode film 3 is deposited, and the gate dielectric film and the gate electrode film are etched to form a gate region. In the meantime, as the gate dielectric film 2, a silicon-based dielectric material selected from a group comprising $SiO_x$ and $SiN_x$, a metal oxide selected from a group comprising $Al_2O_3$, $HfO_2$, $ZrO_2$, $TiO_x$, $TaO_x$, $LaO_x$, $YO_x$ and $GdO_x$, a metal nitride or a combination thereof may be used. However, the present invention is not particularly limited thereto. Also, as the gate electrode film 3, a metal material selected from a group comprising Al, W, Cu, Pt, TiN, TaN, Ti, Ta and Pt or a silicon metal compound selected from a group comprising doped Si, $WSi_x$, $NiSi_x$, $CoSi_x$ and $TiSi_x$ may be used. However, the present invention is not particularly limited thereto. The gate electrode film may be formed using a sputtering or a typical deposition method (PVD, CVD and the like). Subsequently, impurities are implanted using the gate as a protection film, a thermal process is performed and the impurities of the source and drain electrodes are thus activated, so that a MOSFET structure is formed (refer to FIG. 6).

The same dry cleaning process as the above dry cleaning process is performed for the MOSFET structure having the source and drain electrodes and then an interlayer insulation film 4 is formed. As the interlayer insulation film, a compound selected from a group comprising $SiO_x$, $SiN_x$, $SiCO_x$, $SiCO_xN_y$, $SiCO_xH_y$ and a combination thereof may be used. However, the present invention is not particularly limited thereto. Subsequently, the interlayer insulation film 4 is formed with contact holes by using a photolithography process. The same dry cleaning process as the above dry cleaning process is performed for the formed contact holes (thereby, a deformation of the contact due to the oxygen diffusion, which may occur between the contact and the interlayer insulation film, is prevented. That is, the oxygen diffusion is prevented through the dry cleaning process disclosed in the present invention, instead of depositing a separate barrier material.), and a conductive material is deposited and etched back to form contacts. Then, a metal film is deposited for the contacts and is patterned to form a meal wiring 7 (refer to FIG. 7). In the meantime, as the conductive material, a metal material selected from a group comprising Al, W, Cu, Pt, TiN, TaN, Ti, Ta and Pt or a silicon metal compound selected from a group comprising doped Si, $WSi_x$, $NiSi_x$, $CoSi_x$ and $TiSi_x$ may be used.

Figure 7:
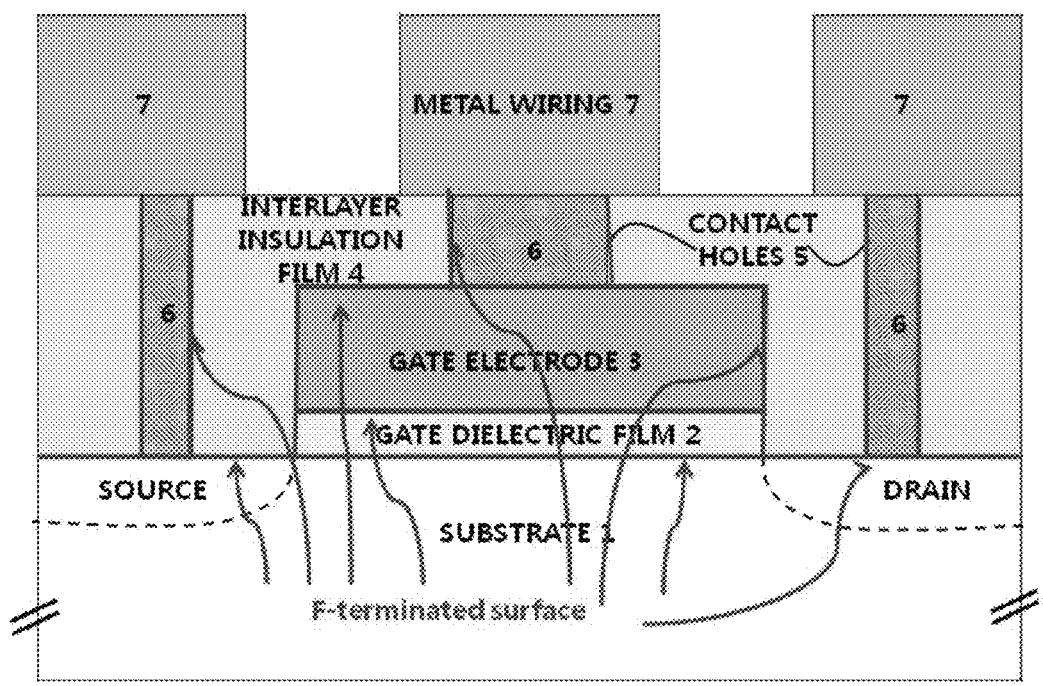
FIG. 7 illustrates a MOSFET structure obtained by depositing an interlayer insulation film, patterning contact holes, performing the dry cleaning processing in the contact holes, filling the contact holes with a conductive material, performing a contact separation process such as etch back, and depositing and patterning a metal film to complete metal wirings to gate, source and drain electrodes, the MOSFET structure being capable of suppressing characteristic deterioration due to oxygen diffusion.

As can be easily understood from FIG. 7, the dry cleaning process using the plasma is performed more than once during the MOSFET device manufacturing process. Thereby, an abutting part (boundary) between the gate dielectric film 2 and the substrate 1, boundaries between the source and drain electrodes and the interlayer insulation film 4, a boundary between the interlayer insulation film 4 and the substrate 1, a boundary between the interlayer insulation film and the contact, a boundary between the gate dielectric film 2 and the gate electrode 3 and the like are formed with the F-terminated surface, respectively. The F-terminated surfaces serve as a barrier for preventing the oxygen diffusion. In particular, as described with reference to FIGS. 2 and 3, the F-terminated surface formed by the dry cleaning process is maintained as it is even under the strong oxidation conditions using the plasma. Therefore, the F-terminated surface is maintained as it is even during the typical thermal process and oxygen introduction process of the semiconductor device manufacturing process, so that the oxygen diffusion can be prevented. Therefore, it is possible to prevent a non-uniform oxide film from growing between a substrate channel layer and a dielectric film, to prevent an increase in a leakage current due to the oxygen diffusion through the dielectric film or gate electrode, and the like.

Although the present invention has been described in relation to the certain exemplary embodiment, it should be understood that the present invention is not limited thereto. The foregoing embodiment can be made into various alterations and modifications without departing from the scope of the appended Claims, and all such alterations and modifications fall within the scope of the present invention.

For example, in the above illustrative embodiment, the dry cleaning process was performed during the specific process. However, the dry cleaning process of the present invention can also be applied to any process in which the oxygen diffusion may be problematic. For example, as shown in FIG. 7, the dry cleaning process of the present invention may be performed before the deposition of the interlayer insulation film, so that surfaces contacting the interlayer insulation film may be F-terminated.

In the above illustrative embodiment, He was used in the dry cleaning process using the plasma. However, the present invention is not limited thereto. For example, Ne, Ar or $N_2$ may also be used, in addition to He.

In the above illustrative embodiment, the Si substrate was used, and the dry cleaning process was performed for the Si substrate to form the F-terminated surface, i.e., Si—F bonding. However, the present invention is not limited thereto. For example, a Ge substrate or a metal oxide substrate such as $HfO_x$, $ZrO_x$ and the like may also be used. When the dry cleaning process is performed for the corresponding substrate, the F-terminated surface is formed on the surface thereof (for example, although not shown and described, it was confirmed that $(NH_4)_xMF_x$ or $MF_x$ by-product (M=Si, Ge or metal) was formed by the dry cleaning process of the present invention.

In the above illustrative embodiment, $NF_3$ and $NH_3$ gases were used as the reaction gas in the dry cleaning process. However, the present invention is not limited thereto. That is, any gas including nitrogen, hydrogen and fluorine such as $NH_3+HF$ and $N_2+H_2+HF$ may be used as the reaction gas, inasmuch as it can form $(NH_4)_xMF_x$ or $MF_x$ by-product (M=Si, Ge or metal) as the by-product.

Therefore, the present invention shall be defined by only the claims and their equivalents.

The invention claimed is:

1. A semiconductor device comprising:
a substrate;
a gate dielectric film formed on the substrate;
a gate electrode formed on the gate dielectric film,
source and drain electrodes, and
an interlayer insulation film configured to cover the gate electrode and the source and drain electrodes and formed with contact holes configured to lead the gate electrode and the source and drain electrodes, the contact holes being filled with a conductive material to thus form contacts,
wherein a boundary between the gate dielectric film and the substrate is formed with an F (fluorine)-terminated surface to serve as a barrier for preventing oxygen diffusion,
wherein a boundary between the gate dielectric film and the gate electrode is also formed with the F-terminated surface,
wherein boundaries between the source and drain electrodes and the contacts and boundaries between the source and drain electrodes and the interlayer insulation film are also formed with the F-terminated surface, and
wherein at least one of a boundary between the interlayer insulation film and the substrate, boundaries between the contacts and the interlayer insulation film, a boundary between the interlayer insulation film and the gate dielectric film, and a boundary between the interlayer insulation film and the gate electrode is also formed with the F-terminated surface.

2. The semiconductor device according to claim 1, wherein the F-terminated surface is formed by a dry cleaning process of applying a plasma gas to a reaction gas comprising nitrogen, hydrogen and fluorine to generate a by-product and volatilizing the by-product.

3. The semiconductor device according to claim 2, wherein He, Ne, Ar or $N_2$ plasma gas is used as the plasma gas.

4. The semiconductor device according to claim 2, wherein $NF_3+NH_3$, $NH_3+HF$ or $N_2+H_2+HF$ gas is used as the reaction gas.

5. The semiconductor device according to claim 1, wherein a silicon-based dielectric material selected from a group comprising $SiO_x$ and $SiN_x$, a metal oxide selected from a group comprising $Al_2O_3$, $HfO_2$, $ZrO_2$, $TiO_x$, $TaO_x$, $LaO_x$, $YO_x$ and $GdO_x$, a metal nitride or a combination thereof is used as the gate dielectric film.

6. The semiconductor device according to claim 1, wherein a metal material selected from a group comprising Al, W, Cu, Pt, TiN, TaN, Ti, Ta and Pt or a silicon metal oxide selected from a group comprising doped Si, $WSi_x$, $NiSi_x$, $CoSi_x$ and $TiSi_x$ is used as the gate electrode.

7. The semiconductor device according to claim 3, wherein a compound selected from a group comprising $SiO_x$, $SiN_x$, $SiCO_x$, $SiCO_xN_y$, $SiCO_xH_y$ and a combination thereof is used as the interlayer insulation film.

* * * * *